United States Patent
Ho et al.

(10) Patent No.: US 9,842,896 B1
(45) Date of Patent: Dec. 12, 2017

(54) ULTRA-HIGH VOLTAGE DEVICES AND METHOD FOR FABRICATING THE SAME

(71) Applicant: Vanguard International Semiconductor Corporation, Hsinchu (TW)

(72) Inventors: Yu-Hao Ho, Keelung (TW); Wen-Hsin Lin, Jhubei (TW); Shin-Cheng Lin, Tainan (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/436,158

(22) Filed: Feb. 17, 2017

(51) Int. Cl.
| H01L 29/66 | (2006.01) |
|---|---|
| H01L 29/06 | (2006.01) |
| H01L 29/40 | (2006.01) |
| H01L 21/265 | (2006.01) |

(52) U.S. Cl.
CPC .... *H01L 29/0634* (2013.01); *H01L 21/26513* (2013.01); *H01L 29/408* (2013.01)

(58) Field of Classification Search
None
See application file for complete search history.

(56) References Cited

U.S. PATENT DOCUMENTS

| 8,866,252 | B2 * | 10/2014 | Trajkovic | .......... H01L 29/66325 |
|---|---|---|---|---|
| | | | | 257/492 |
| 2016/0043217 | A1 * | 2/2016 | Cai | ...................... H01L 27/0922 |
| | | | | 257/337 |
| 2017/0213894 | A1 * | 7/2017 | Mallikarjunaswamy | |
| | | | | ............................. H01L 29/407 |

FOREIGN PATENT DOCUMENTS

| TW | 342532 B | 10/1998 |
|---|---|---|
| TW | 394999 B | 6/2000 |
| TW | 200605320 A | 2/2006 |
| TW | 201517239 A | 5/2015 |

* cited by examiner

*Primary Examiner* — Bradley K Smith
(74) *Attorney, Agent, or Firm* — Birch, Stewart, Kolasch & Birch, LLP

(57) ABSTRACT

An ultra-high voltage device is provided. The ultra-high voltage device includes a substrate, a first well zone formed in the substrate, a second well zone formed in the substrate adjacent to the first well zone, a gate oxide layer formed on the first well zone and the second well zone, a gate formed on the gate oxide layer, an insulation region formed on the surface of the second well zone, a first implant region formed in the second well zone underneath the insulation region, a second implant region formed below the first implant region, and a junction formed between the first implant region and the second implant region. At least one of the first implant region and the second implant region includes at least two sub-implant regions having different implant concentrations. The sub-implant region having the higher implant concentration is adjacent to the junction.

18 Claims, 10 Drawing Sheets

ULTRA-HIGH VOLTAGE DEVICES AND METHOD FOR FABRICATING THE SAME

TECHNICAL FIELD

The technical field relates to an ultra-high voltage device which is capable of effectively improving breakdown voltage (BV).

BACKGROUND

For a conventional ultra-high voltage device, the concentration of the implant region below the insulation region in the structure thereof usually plays a main role in influencing the on-resistance (Rds-on). When the concentration of the implant region is high, the on-resistance (Rds-on) of the device is reduced. However, at the same time, the breakdown voltage (BV) of the device is also decreased. During mass production, the implant region having a low concentration should be adopted as the main process conditions due to requirement for a sufficiently large process window of the breakdown voltage (BV) in the device.

Although the larger process window of the breakdown voltage (BV) of the device is obtained by adopting an implant region having a low concentration, in this case, the on-resistance (Rds-on) obtained by adopting the low-concentration implant region is much higher than that obtained by adopting a high-concentration implant region in the device, affecting device performance.

Therefore, how to maintain low on-resistance (Rds-on) circumstances, while also effectively improving the process window of the breakdown voltage (BV), is the goal that the relevant industry needs to strive to achieve.

SUMMARY

One embodiment of the invention provides an ultra-high voltage device comprising a substrate, a first well zone, a second well zone, a gate oxide layer, a gate, an insulation region, a first implant region, and a second implant region. The first well zone is formed in the substrate. The second well zone is formed in the substrate adjacent to the first well zone. The gate oxide layer is formed on the first well zone and the second well zone of the substrate. The gate is formed on the gate oxide layer. The insulation region is formed on the surface of the second well zone of the substrate. The first implant region is formed in the second well zone underneath the insulation region. The second implant region is formed below the first implant region. A junction is formed between the first implant region and the second implant region. At least one of the first implant region and the second implant region comprises at least two sub-implant regions having different implant concentrations. The sub-implant region having the higher implant concentration is adjacent to the junction. The sub-implant region having the lower implant concentration is distant from the junction.

In one embodiment, the substrate is a P-type substrate.

In this embodiment, the first well zone is a P-type well zone, the second well zone is an N-type well zone, the first implant region is an N-type implant region, and the second implant region is a P-type implant region.

In one embodiment, the first implant region or the second implant region not including the sub-implant regions has an implant concentration ranging from $1.0E15$ cm$^{-3}$ to $1.0E16$ cm$^{-3}$.

In one embodiment, the sub-implant region having the higher implant concentration has an implant concentration ranging from $2.0E16$ cm$^{-3}$ to $6.0E16$ cm$^{-3}$.

In one embodiment, the sub-implant region having the lower implant concentration has an implant concentration ranging from $1.0E16$ cm$^{-3}$ to $4.0E16$ cm$^{-3}$.

In one embodiment, the insulation region comprises a field oxide layer or a shallow trench isolation (STI).

One embodiment of the invention provides a method for fabricating an ultra-high voltage device, comprising the following steps. A substrate comprising a first well zone, a second well zone, a gate oxide layer, a gate, and an insulation region is provided. The first well zone is adjacent to the second well zone. The gate oxide layer is formed on the first well zone and the second well zone. The gate is formed on the gate oxide layer. The insulation region is formed on the surface of the second well zone. A first implant process is performed to form a first implant region in the second well zone underneath the insulation region. A second implant process is performed to form a second implant region below the first implant region. A junction is formed between the first implant region and the second implant region. At least one of the first implant region and the second implant region comprises at least two sub-implant regions having different implant concentrations. The sub-implant region having the higher implant concentration is adjacent to the junction. The sub-implant region having the lower implant concentration is distant from the junction.

In one embodiment, the first implant process provides a single implant concentration to form the first implant region having the single implant concentration.

In one embodiment, the first implant process provides a higher implant concentration and a lower implant concentration to form the first implant region comprising the sub-implant regions having different implant concentrations.

In one embodiment, the second implant process provides a single implant concentration to form the second implant region having the single implant concentration.

In one embodiment, the second implant process provides a higher implant concentration and a lower implant concentration to form the second implant region comprising the sub-implant regions having different implant concentrations.

In the present invention, the implant profile of the second implant region is altered in cases where the first implant region in the second well zone (the draft zone) maintains a high implant concentration. That is, in the second implant region, at least two sub-implant regions are formed which have different implant concentrations, specifically, the sub-implant region having the higher implant concentration is adjacent to the junction between the first implant region and the second implant region, and the sub-implant region having the lower implant concentration is distant from the junction between the first implant region and the second implant region. A non-gradient implant profile is thus formed in the second implant region due to the sub-implant regions having different implant concentrations. Therefore, besides maintaining a low on-resistance (Rds-on) in the device through the formation of the first implant region with a high implant concentration, the breakdown voltage (BV) of the device is also effectively improved by the arrangement of the specific implant profile of the second implant region which is capable of providing a larger depletion space below the insulation region.

In addition, the disclosed implant technique capable of forming non-gradient profiles has been widely applied in various semiconductor structures having a field oxide layer or shallow trench isolation (STI).

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
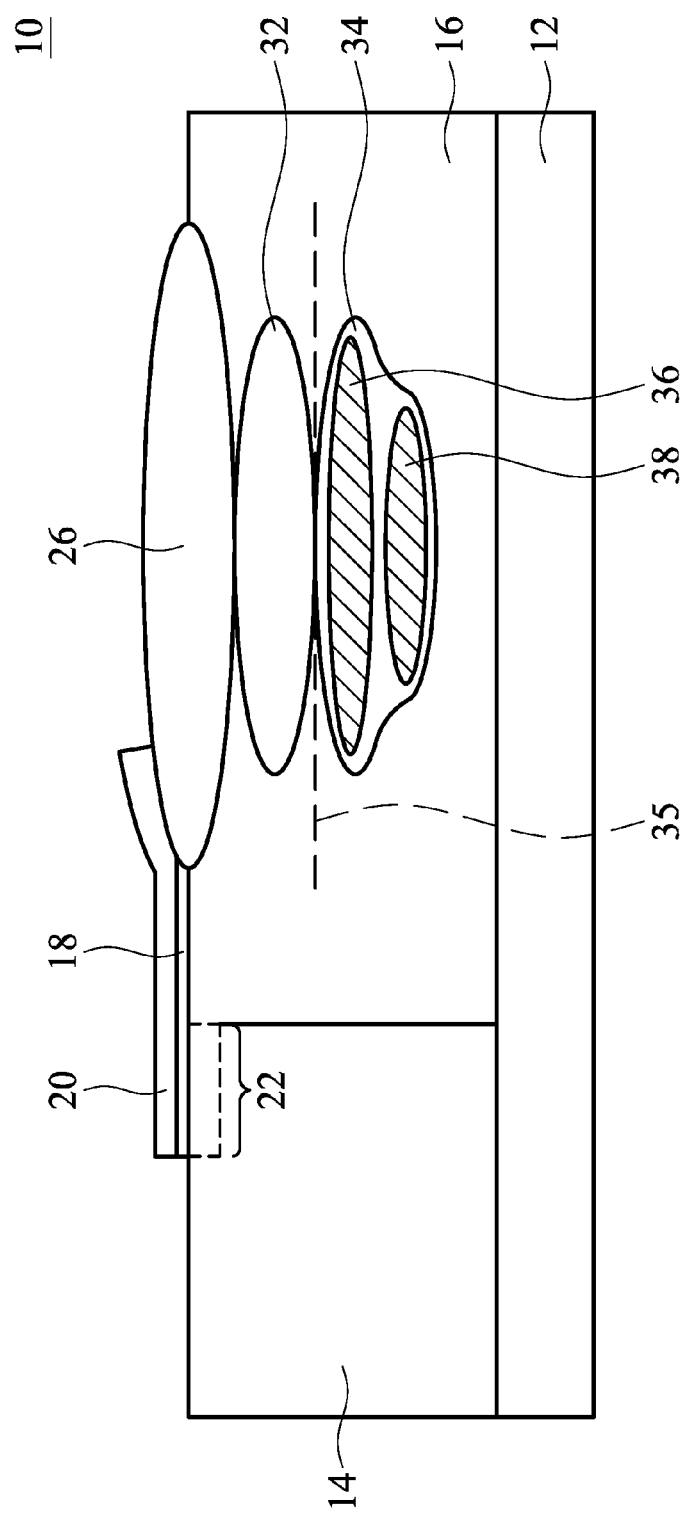
FIG. 1 is a cross-sectional view of an ultra-high voltage device in accordance with one embodiment of the invention.

Referring to FIG. 1, in accordance with one embodiment of the invention, an ultra-high voltage device 10 is provided. FIG. 1 is a cross-sectional view of the ultra-high voltage device 10.

As shown in FIG. 1, in this embodiment, the ultra-high voltage device 10 comprises a substrate 12, a first well zone 14, a second well zone 16, a gate oxide layer 18, a gate 20, a channel 22, an insulation region 26, a first implant region 32, and a second implant region 34.

The first well zone 14 is formed in the substrate 12. The second well zone 16 is formed in the substrate 12 adjacent to the first well zone 14. The gate oxide layer 18 is formed on the first well zone 14 and the second well zone 16 of the substrate 12. The gate 20 is formed on the gate oxide layer 18. The channel 22 is formed in the first well zone 14 below the gate oxide layer 18. The insulation region 26 is formed on the surface of the second well zone 16 of the substrate 12. The first implant region 32 is formed in the second well zone 16 underneath the insulation region 26. The second implant region 34 is formed below the first implant region 32. A junction 35 is formed between the first implant region 32 and the second implant region 34.

Specifically, at least one of the first implant region 32 and the second implant region 34 comprises at least two sub-implant regions. For example, the second implant region 34 comprises a first sub-implant region 36 and a second sub-implant region 38, as shown in FIG. 1. The sub-implant regions (36 and 38) have different implant concentrations. The sub-implant region having the higher implant concentration is adjacent to the junction 35 between the first implant region 32 and the second implant region 34. The sub-implant region having the lower implant concentration is distant from the junction 35 between the first implant region 32 and the second implant region 34. For example, the first sub-implant region 36 having the higher implant concentration is adjacent to the junction 35 between the first implant region 32 and the second implant region 34. The second sub-implant region 38 having the lower implant concentration is distant from the junction 35 between the first implant region 32 and the second implant region 34.

In some embodiments, the substrate 12 may be a P-type substrate.

When the substrate 12 is a P-type substrate, the first well zone 14 is a P-type well zone, the second well zone 16 is an N-type well zone, the first implant region 32 is an N-type implant region, and the second implant region 34 is a P-type implant region.

In some embodiments, the first implant region 32 or the second implant region 34 not including the sub-implant regions has an implant concentration ranging from $1.0E15$ $cm^{-3}$ to $1.0E16$ $cm^{-3}$. In this embodiment, the first implant region 32 not including the first sub-implant region 36 and the second sub-implant region 38 has an implant concentration ranging from $1.0E15$ $cm^{-3}$ to $1.0E16$ $cm^{-3}$.

In some embodiments, the sub-implant region having the higher implant concentration has an implant concentration ranging from $2.0E16$ $cm^{-3}$ to $6.0E16$ $cm^{-3}$. In this embodiment, the first sub-implant region 36 having the higher implant concentration has an implant concentration ranging from $2.0E16$ $cm^{-3}$ to $6.0E16$ $cm^{-3}$.

In some embodiments, the sub-implant region having the lower implant concentration has an implant concentration ranging from $1.0E16$ $cm^{-3}$ to $4.0E16$ $cm^{-3}$. In this embodiment, the second sub-implant region 38 having the lower implant concentration has an implant concentration ranging from $1.0E16$ $cm^{-3}$ to $4.0E16$ $cm^{-3}$.

In some embodiments, the insulation region 26 may comprise a field oxide layer, as shown in FIG. 1.

Figure 2:
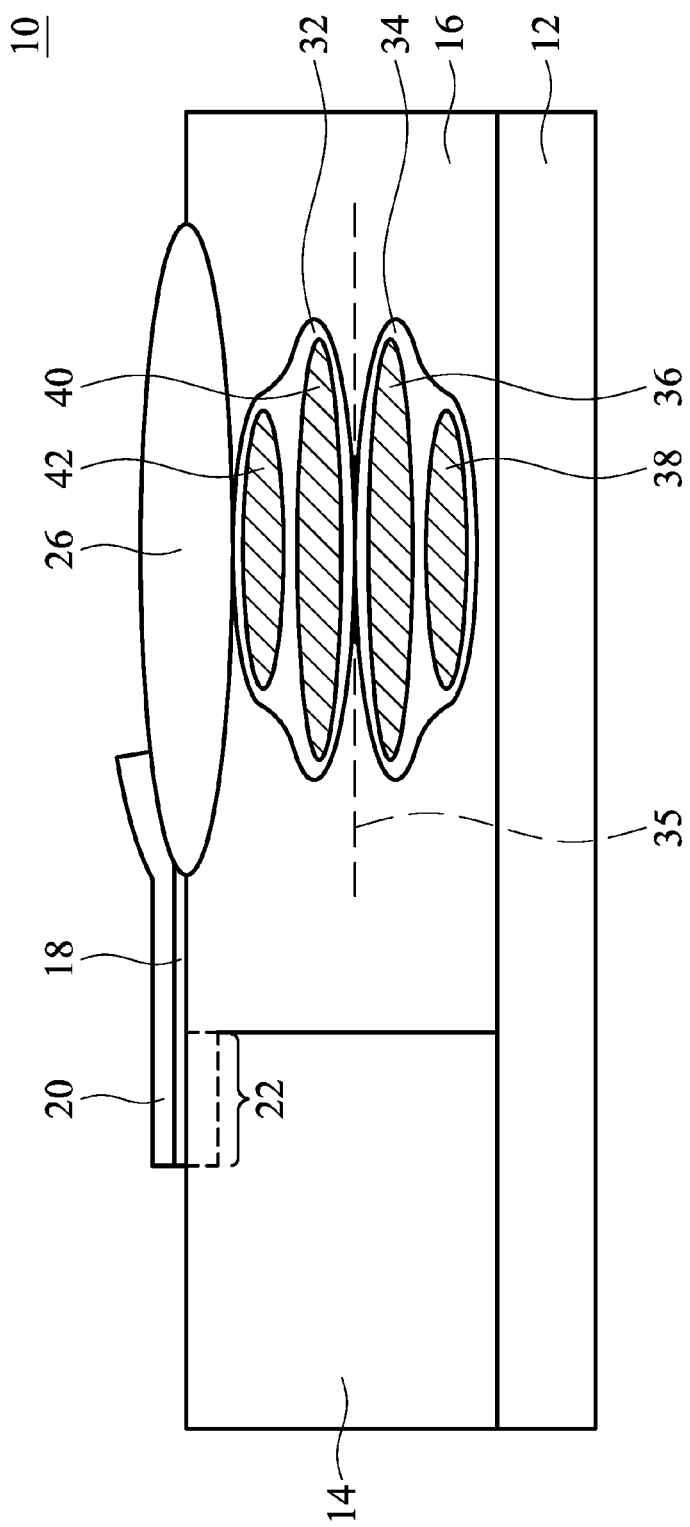
FIG. 2 is a cross-sectional view of an ultra-high voltage device in accordance with one embodiment of the invention.

Referring to FIG. 2, in accordance with one embodiment of the invention, an ultra-high voltage device 10 is provided. FIG. 2 is a cross-sectional view of the ultra-high voltage device 10.

As shown in FIG. 2, in this embodiment, the ultra-high voltage device 10 comprises a substrate 12, a first well zone 14, a second well zone 16, a gate oxide layer 18, a gate 20, a channel 22, an insulation region 26, a first implant region 32, and a second implant region 34.

The first well zone 14 is formed in the substrate 12. The second well zone 16 is formed in the substrate 12 adjacent to the first well zone 14. The gate oxide layer 18 is formed on the first well zone 14 and the second well zone 16 of the substrate 12. The gate 20 is formed on the gate oxide layer 18. The channel 22 is formed in the first well zone 14 below the gate oxide layer 18. The insulation region 26 is formed on the surface of the second well zone 16 of the substrate 12. The first implant region 32 is formed in the second well zone 16 underneath the insulation region 26. The second implant region 34 is formed below the first implant region 32. A junction 35 is formed between the first implant region 32 and the second implant region 34.

Specifically, at least one of the first implant region 32 and the second implant region 34 comprises at least two sub-implant regions. For example, the second implant region 34 comprises a first sub-implant region 36 and a second sub-implant region 38, and the first implant region 32 comprises a third sub-implant region 40 and a fourth sub-implant region 42, as shown in FIG. 2. The sub-implant regions (36/38 and 40/42) have different implant concentrations. The sub-implant region having the higher implant concentration is adjacent to the junction 35 between the first implant region 32 and the second implant region 34. The sub-implant region having the lower implant concentration is distant from the junction 35 between the first implant region 32 and the second implant region 34. For example, the first sub-implant region 36 having the higher implant concentration is adjacent to the junction 35 between the first implant region 32 and the second implant region 34. The second sub-implant region 38 having the lower implant concentration is distant from the junction 35 between the first implant region 32 and the second implant region 34. The third sub-implant region 40 having the higher implant concentration is adjacent to the junction 35 between the first implant region 32 and the second implant region 34. The fourth sub-implant region 42 having the lower implant concentration is distant from the junction 35 between the first implant region 32 and the second implant region 34.

In some embodiments, the substrate 12 may be a P-type substrate.

When the substrate 12 is a P-type substrate, the first well zone 14 is a P-type well zone, the second well zone 16 is an N-type well zone, the first implant region 32 is an N-type implant region, and the second implant region 34 is a P-type implant region.

In some embodiments, the sub-implant region having the higher implant concentration has an implant concentration ranging from $2.0E16$ $cm^{-3}$ to $6.0E16$ $cm^{-3}$. In this embodiment, the first sub-implant region 36 and the third sub-implant region 40 having the higher implant concentration have an implant concentration ranging from $2.0E16$ $cm^{-3}$ to $6.0E16$ $cm^{-3}$.

In some embodiments, the sub-implant region having the lower implant concentration has an implant concentration ranging from $1.0E16$ $cm^{-3}$ to $4.0E16$ $cm^{-3}$. In this embodiment, the second sub-implant region 38 and the fourth sub-implant region 42 having the lower implant concentration have an implant concentration ranging from $1.0E16$ $cm^{-3}$ to $4.0E16$ $cm^{-3}$.

In some embodiments, the insulation region 26 may comprise a field oxide layer, as shown in FIG. 2.

Figure 3:
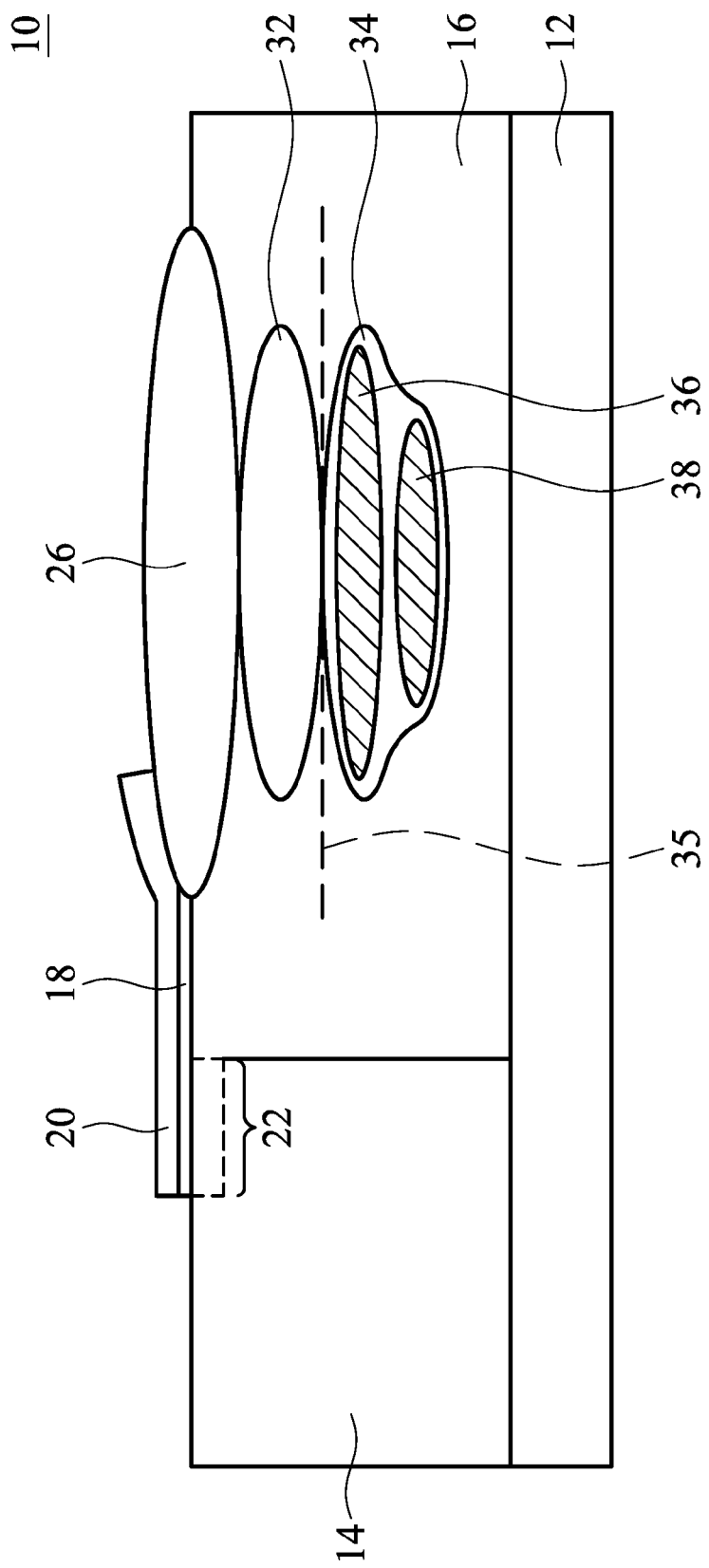
FIG. 3 is a cross-sectional view of an ultra-high voltage device in accordance with one embodiment of the invention.

Referring to FIG. 3, in accordance with one embodiment of the invention, an ultra-high voltage device 10 is provided. FIG. 3 is a cross-sectional view of the ultra-high voltage device 10.

As shown in FIG. 3, in this embodiment, the ultra-high voltage device 10 comprises a substrate 12, a first well zone 14, a second well zone 16, a gate oxide layer 18, a gate 20, a channel 22, an insulation region 26, a first implant region 32, and a second implant region 34.

The first well zone 14 is formed in the substrate 12. The second well zone 16 is formed in the substrate 12 adjacent to the first well zone 14. The gate oxide layer 18 is formed on the first well zone 14 and the second well zone 16 of the substrate 12. The gate 20 is formed on the gate oxide layer 18. The channel 22 is formed in the first well zone 14 below the gate oxide layer 18. The insulation region 26 is formed on the surface of the second well zone 16 of the substrate 12. The first implant region 32 is formed in the second well zone 16 underneath the insulation region 26. The second implant region 34 is formed below the first implant region 32. A junction 35 is formed between the first implant region 32 and the second implant region 34.

Specifically, at least one of the first implant region 32 and the second implant region 34 comprises at least two sub-implant regions. For example, the second implant region 34 comprises a first sub-implant region 36 and a second sub-implant region 38, as shown in FIG. 3. The sub-implant regions (36 and 38) have different implant concentrations. The sub-implant region having the higher implant concentration is adjacent to the junction 35 between the first implant region 32 and the second implant region 34. The sub-implant region having the lower implant concentration is distant from the junction 35 between the first implant region 32 and the second implant region 34. For example, the first sub-implant region 36 having the higher implant concentration is adjacent to the junction 35 between the first implant region 32 and the second implant region 34. The second sub-implant region 38 having the lower implant concentration is distant from the junction 35 between the first implant region 32 and the second implant region 34.

In some embodiments, the substrate 12 may be an N-type substrate.

When the substrate 12 is an N-type substrate, the first well zone 14 is an N-type well zone, the second well zone 16 is a P-type well zone, the first implant region 32 is a P-type implant region, and the second implant region 34 is an N-type implant region.

In some embodiments, the first implant region 32 or the second implant region 34 not including the sub-implant regions has an implant concentration ranging from $1.0E15$ $cm^{-3}$ to $1.0E16$ $cm^{-3}$. In this embodiment, the first implant region 32 not including the first sub-implant region 36 and the second sub-implant region 38 has an implant concentration ranging from $1.0E15$ $cm^{-3}$ to $1.0E16$ $cm^{-3}$.

In some embodiments, the sub-implant region having the higher implant concentration has an implant concentration ranging from $2.0E16$ $cm^{-3}$ to $6.0E16$ $cm^{-3}$. In this embodiment, the first sub-implant region 36 having the higher implant concentration has an implant concentration ranging from $2.0E16$ $cm^{-3}$ to $6.0E16$ $cm^{-3}$.

In some embodiments, the sub-implant region having the lower implant concentration has an implant concentration ranging from $1.0E16$ $cm^{-3}$ to $4.0E16$ $cm^{-3}$. In this embodiment, the second sub-implant region 38 having the lower implant concentration has an implant concentration ranging from $1.0E16$ $cm^{-3}$ to $4.0E16$ $cm^{-3}$.

In some embodiments, the insulation region 26 may comprise a field oxide layer, as shown in FIG. 3.

Figure 4:
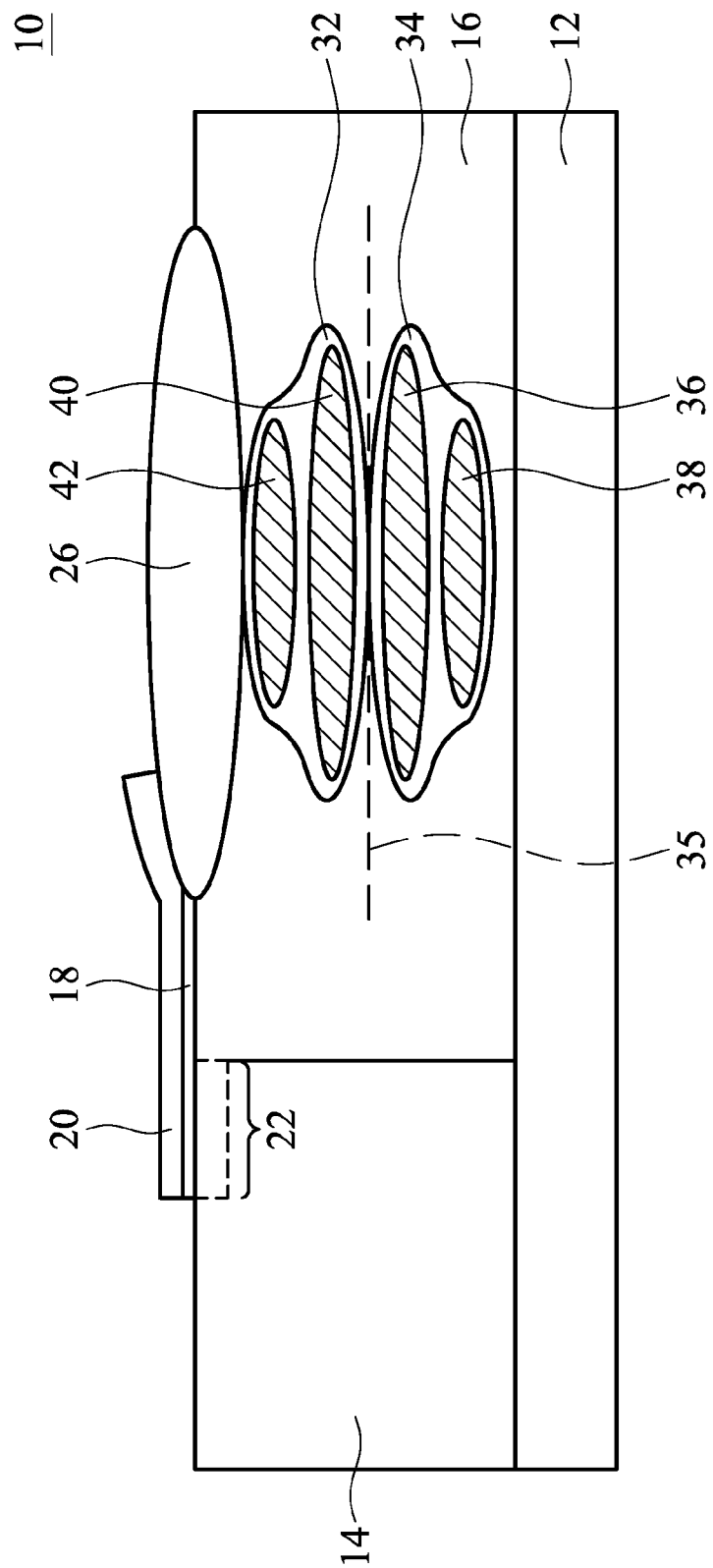
FIG. 4 is a cross-sectional view of an ultra-high voltage device in accordance with one embodiment of the invention.

Referring to FIG. 4, in accordance with one embodiment of the invention, an ultra-high voltage device 10 is provided. FIG. 4 is a cross-sectional view of the ultra-high voltage device 10.

As shown in FIG. 4, in this embodiment, the ultra-high voltage device 10 comprises a substrate 12, a first well zone 14, a second well zone 16, a gate oxide layer 18, a gate 20, a channel 22, an insulation region 26, a first implant region 32, and a second implant region 34.

The first well zone 14 is formed in the substrate 12. The second well zone 16 is formed in the substrate 12 adjacent to the first well zone 14. The gate oxide layer 18 is formed on the first well zone 14 and the second well zone 16 of the substrate 12. The gate 20 is formed on the gate oxide layer 18. The channel 22 is formed in the first well zone 14 below the gate oxide layer 18. The insulation region 26 is formed on the surface of the second well zone 16 of the substrate 12. The first implant region 32 is formed in the second well zone 16 underneath the insulation region 26. The second implant region 34 is formed below the first implant region 32. A junction 35 is formed between the first implant region 32 and the second implant region 34.

Specifically, at least one of the first implant region 32 and the second implant region 34 comprises at least two sub-implant regions. For example, the second implant region 34 comprises a first sub-implant region 36 and a second sub-implant region 38, and the first implant region 32 comprises a third sub-implant region 40 and a fourth sub-implant region 42, as shown in FIG. 4. The sub-implant regions (36/38 and 40/42) have different implant concentrations. The sub-implant region having the higher implant concentration is adjacent to the junction 35 between the first implant region 32 and the second implant region 34. The sub-implant region having the lower implant concentration is distant from the junction 35 between the first implant region 32 and the second implant region 34. For example, the first sub-implant region 36 having the higher implant concentration is adjacent to the junction 35 between the first implant region 32 and the second implant region 34. The second sub-implant region 38 having the lower implant concentration is distant from the junction 35 between the first implant region 32 and the second implant region 34. The third sub-implant region 40 having the higher implant concentration is adjacent to the junction 35 between the first implant region 32 and the second implant region 34. The fourth sub-implant region 42 having the lower implant concentration is distant from the junction 35 between the first implant region 32 and the second implant region 34.

In some embodiments, the substrate 12 may be an N-type substrate.

When the substrate 12 is an N-type substrate, the first well zone 14 is an N-type well zone, the second well zone 16 is a P-type well zone, the first implant region 32 is a P-type implant region, and the second implant region 34 is an N-type implant region.

In some embodiments, the sub-implant region having the higher implant concentration has an implant concentration ranging from $2.0E16$ $cm^{-3}$ to $6.0E16$ $cm^{-3}$. In this embodiment, the first sub-implant region 36 and the third sub-implant region 40 having the higher implant concentration have an implant concentration ranging from $2.0E16$ $cm^{-3}$ to $6.0E16$ $cm^{-3}$.

In some embodiments, the sub-implant region having the lower implant concentration has an implant concentration ranging from $1.0E16$ $cm^{-3}$ to $4.0E16$ $cm^{-3}$. In this embodiment, the second sub-implant region 38 and the fourth sub-implant region 42 having the lower implant concentration have an implant concentration ranging from $1.0E16$ $cm^{-3}$ to $4.0E16$ $cm^{-3}$.

In some embodiments, the insulation region 26 may comprise a field oxide layer, as shown in FIG. 4.

Figure 5:
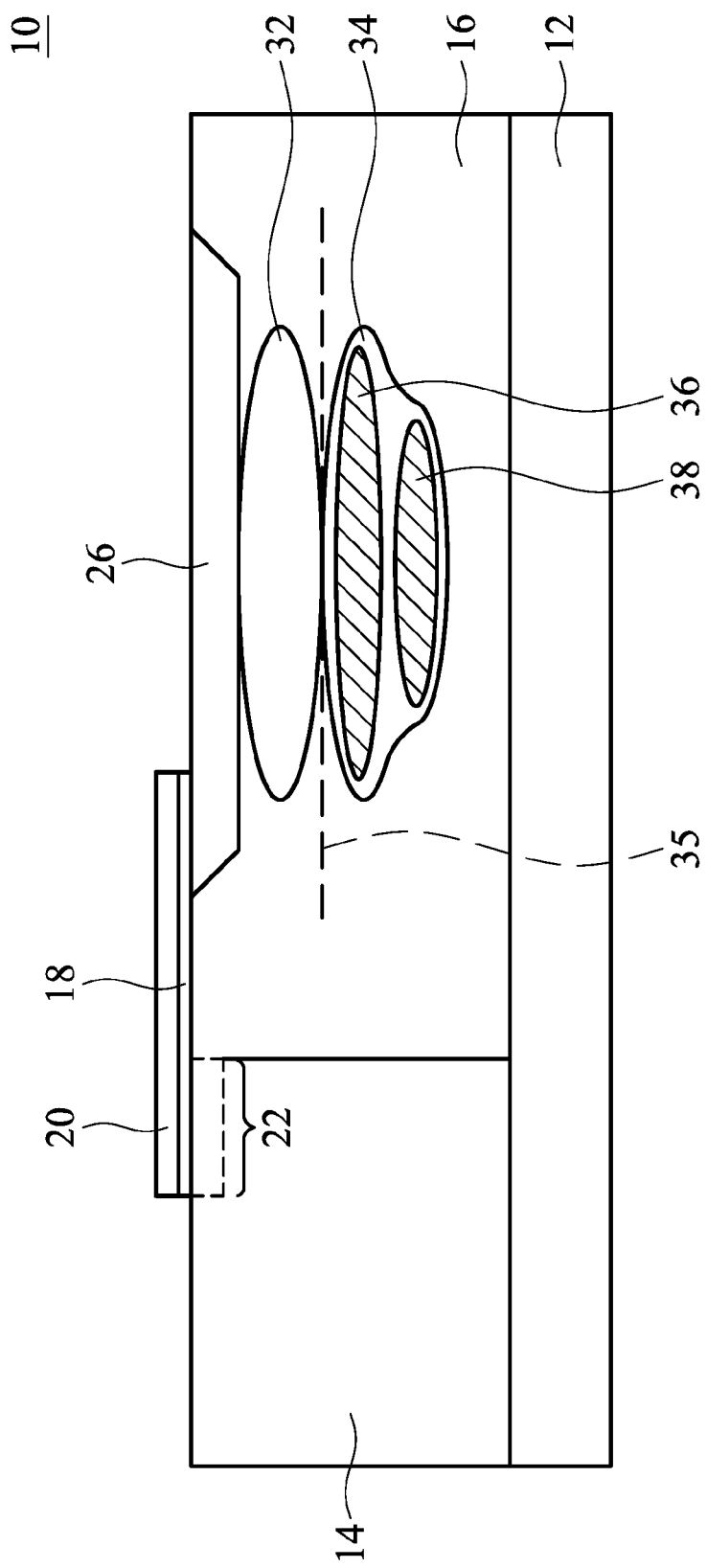
FIG. 5 is a cross-sectional view of an ultra-high voltage device in accordance with one embodiment of the invention.

Referring to FIG. 5, in accordance with one embodiment of the invention, an ultra-high voltage device 10 is provided. FIG. 5 is a cross-sectional view of the ultra-high voltage device 10.

As shown in FIG. 5, in this embodiment, the ultra-high voltage device 10 comprises a substrate 12, a first well zone 14, a second well zone 16, a gate oxide layer 18, a gate 20, a channel 22, an insulation region 26, a first implant region 32, and a second implant region 34.

The first well zone 14 is formed in the substrate 12. The second well zone 16 is formed in the substrate 12 adjacent to the first well zone 14. The gate oxide layer 18 is formed on the first well zone 14 and the second well zone 16 of the substrate 12. The gate 20 is formed on the gate oxide layer 18. The channel 22 is formed in the first well zone 14 below the gate oxide layer 18. The insulation region 26 is formed on the surface of the second well zone 16 of the substrate 12. The first implant region 32 is formed in the second well zone 16 underneath the insulation region 26. The second implant region 34 is formed below the first implant region 32. A junction 35 is formed between the first implant region 32 and the second implant region 34.

Specifically, at least one of the first implant region 32 and the second implant region 34 comprises at least two sub-implant regions. For example, the second implant region 34 comprises a first sub-implant region 36 and a second sub-implant region 38, as shown in FIG. 5. The sub-implant regions (36 and 38) have different implant concentrations. The sub-implant region having the higher implant concentration is adjacent to the junction 35 between the first implant region 32 and the second implant region 34. The sub-implant region having the lower implant concentration is distant from the junction 35 between the first implant region 32 and the second implant region 34. For example, the first sub-implant region 36 having the higher implant concentration is adjacent to the junction 35 between the first implant region 32 and the second implant region 34. The second sub-implant region 38 having the lower implant concentration is distant from the junction 35 between the first implant region 32 and the second implant region 34.

In some embodiments, the substrate 12 may be a P-type substrate.

When the substrate 12 is a P-type substrate, the first well zone 14 is a P-type well zone, the second well zone 16 is an N-type well zone, the first implant region 32 is an N-type implant region, and the second implant region 34 is a P-type implant region.

In some embodiments, the first implant region 32 or the second implant region 34 not including the sub-implant regions has an implant concentration ranging from $1.0E15$ $cm^{-3}$ to $1.0E16$ $cm^{-3}$. In this embodiment, the first implant region 32 not including the first sub-implant region 36 and the second sub-implant region 38 has an implant concentration ranging from $1.0E15$ $cm^{-3}$ to $1.0E16$ $cm^{-3}$.

In some embodiments, the sub-implant region having the higher implant concentration has an implant concentration ranging from $2.0E16$ $cm^{-3}$ to $6.0E16$ $cm^{-3}$. In this embodiment, the first sub-implant region 36 having the higher implant concentration has an implant concentration ranging from $2.0E16$ $cm^{-3}$ to $6.0E16$ $cm^{-3}$.

In some embodiments, the sub-implant region having the lower implant concentration has an implant concentration ranging from $1.0E16$ $cm^{-3}$ to $4.0E16$ $cm^{-3}$. In this embodiment, the second sub-implant region 38 having the lower implant concentration has an implant concentration ranging from $1.0E16$ $cm^{-3}$ to $4.0E16$ $cm^{-3}$.

In some embodiments, the insulation region 26 may comprise a shallow trench isolation (STI), as shown in FIG. 5.

Figure 6:
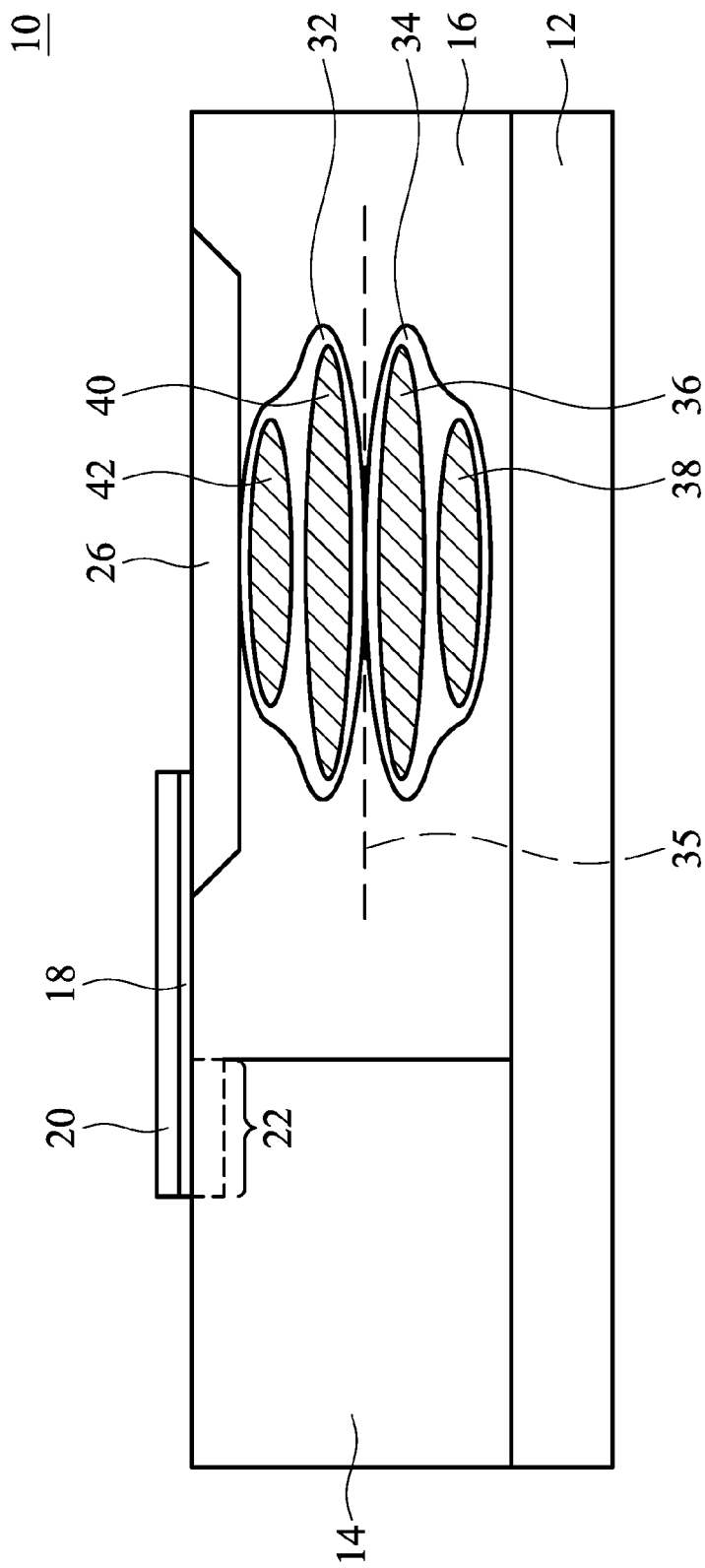
FIG. 6 is a cross-sectional view of an ultra-high voltage device in accordance with one embodiment of the invention.

Referring to FIG. 6, in accordance with one embodiment of the invention, an ultra-high voltage device 10 is provided. FIG. 6 is a cross-sectional view of the ultra-high voltage device 10.

As shown in FIG. 6, in this embodiment, the ultra-high voltage device 10 comprises a substrate 12, a first well zone 14, a second well zone 16, a gate oxide layer 18, a gate 20, a channel 22, an insulation region 26, a first implant region 32, and a second implant region 34.

The first well zone 14 is formed in the substrate 12. The second well zone 16 is formed in the substrate 12 adjacent to the first well zone 14. The gate oxide layer 18 is formed on the first well zone 14 and the second well zone 16 of the substrate 12. The gate 20 is formed on the gate oxide layer 18. The channel 22 is formed in the first well zone 14 below the gate oxide layer 18. The insulation region 26 is formed on the surface of the second well zone 16 of the substrate 12. The first implant region 32 is formed in the second well zone 16 underneath the insulation region 26. The second implant region 34 is formed below the first implant region 32. A junction 35 is formed between the first implant region 32 and the second implant region 34.

Specifically, at least one of the first implant region 32 and the second implant region 34 comprises at least two sub-implant regions. For example, the second implant region 34 comprises a first sub-implant region 36 and a second sub-implant region 38, and the first implant region 32 comprises a third sub-implant region 40 and a fourth sub-implant region 42, as shown in FIG. 6. The sub-implant regions (36/38 and 40/42) have different implant concentrations. The sub-implant region having the higher implant concentration is adjacent to the junction 35 between the first implant region 32 and the second implant region 34. The sub-implant region having the lower implant concentration is distant from the junction 35 between the first implant region 32 and the second implant region 34. For example, the first sub-implant region 36 having the higher implant concentration is adjacent to the junction 35 between the first implant region 32 and the second implant region 34. The second sub-implant region 38 having the lower implant concentration is distant from the junction 35 between the first implant region 32 and the second implant region 34. The third sub-implant region 40 having the higher implant concentration is adjacent to the junction 35 between the first implant region 32 and the second implant region 34. The fourth sub-implant region 42 having the lower implant concentration is distant from the junction 35 between the first implant region 32 and the second implant region 34.

In some embodiments, the substrate 12 may be a P-type substrate.

When the substrate 12 is a P-type substrate, the first well zone 14 is a P-type well zone, the second well zone 16 is an N-type well zone, the first implant region 32 is an N-type implant region, and the second implant region 34 is a P-type implant region.

In some embodiments, the sub-implant region having the higher implant concentration has an implant concentration ranging from $2.0E16\ cm^{-3}$ to $6.0E16\ cm^{-3}$. In this embodiment, the first sub-implant region 36 and the third sub-implant region 40 having the higher implant concentration have an implant concentration ranging from $2.0E16\ cm^{-3}$ to $6.0E16\ cm^{-3}$.

In some embodiments, the sub-implant region having the lower implant concentration has an implant concentration ranging from $1.0E16\ cm^{-3}$ to $4.0E16\ cm^{-3}$. In this embodiment, the second sub-implant region 38 and the fourth sub-implant region 42 having the lower implant concentration have an implant concentration ranging from $1.0E16\ cm^{-3}$ to $4.0E16\ cm^{-3}$.

In some embodiments, the insulation region 26 may comprise a shallow trench isolation (STI), as shown in FIG. 6.

Figure 7:
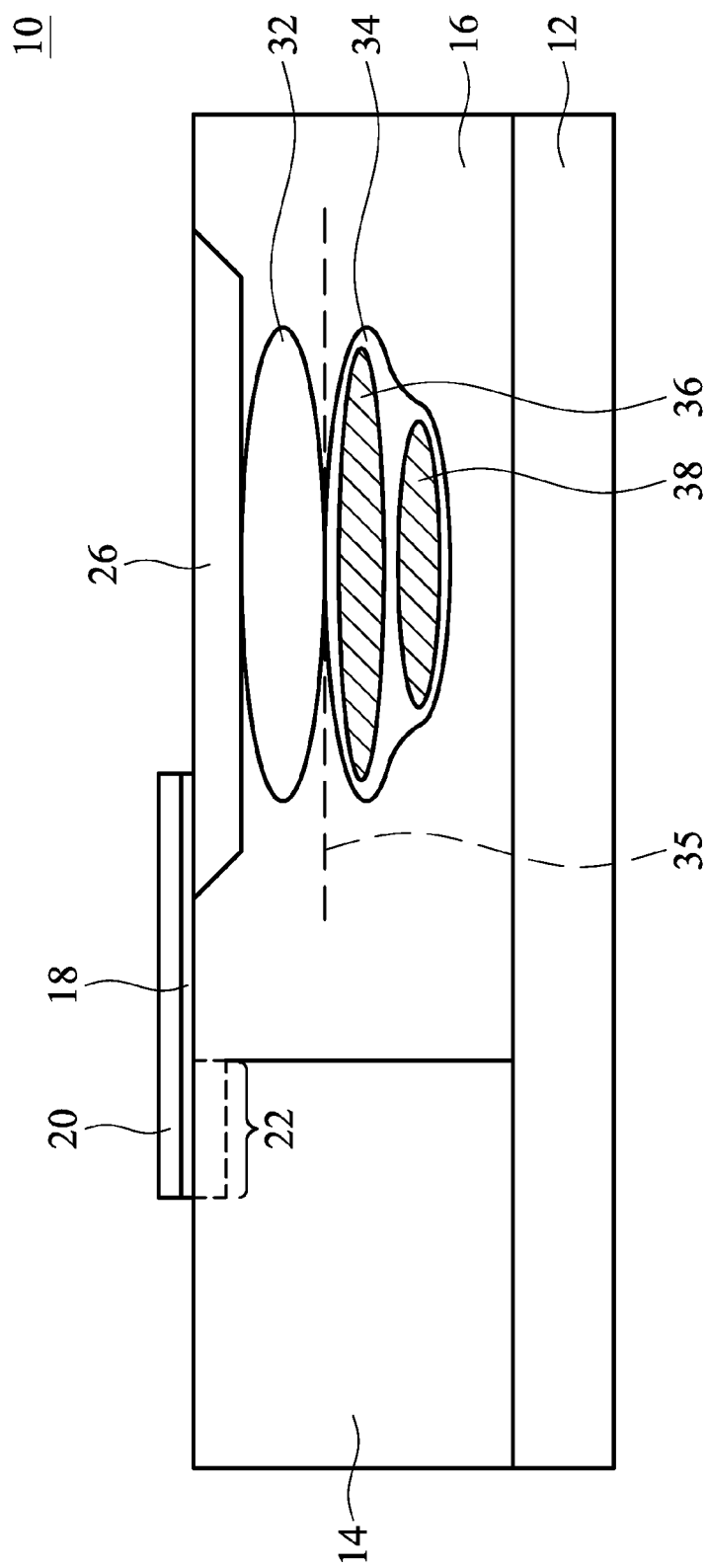
FIG. 7 is a cross-sectional view of an ultra-high voltage device in accordance with one embodiment of the invention.

Referring to FIG. 7, in accordance with one embodiment of the invention, an ultra-high voltage device 10 is provided. FIG. 7 is a cross-sectional view of the ultra-high voltage device 10.

As shown in FIG. 7, in this embodiment, the ultra-high voltage device 10 comprises a substrate 12, a first well zone 14, a second well zone 16, a gate oxide layer 18, a gate 20, a channel 22, an insulation region 26, a first implant region 32, and a second implant region 34.

The first well zone 14 is formed in the substrate 12. The second well zone 16 is formed in the substrate 12 adjacent to the first well zone 14. The gate oxide layer 18 is formed on the first well zone 14 and the second well zone 16 of the substrate 12. The gate 20 is formed on the gate oxide layer 18. The channel 22 is formed in the first well zone 14 below the gate oxide layer 18. The insulation region 26 is formed on the surface of the second well zone 16 of the substrate 12. The first implant region 32 is formed in the second well zone 16 underneath the insulation region 26. The second implant region 34 is formed below the first implant region 32. A junction 35 is formed between the first implant region 32 and the second implant region 34.

Specifically, at least one of the first implant region 32 and the second implant region 34 comprises at least two sub-implant regions. For example, the second implant region 34 comprises a first sub-implant region 36 and a second sub-implant region 38, as shown in FIG. 7. The sub-implant regions (36 and 38) have different implant concentrations. The sub-implant region having the higher implant concentration is adjacent to the junction 35 between the first implant region 32 and the second implant region 34. The sub-implant region having the lower implant concentration is distant from the junction 35 between the first implant region 32 and the second implant region 34. For example, the first sub-implant region 36 having the higher implant concentration is adjacent to the junction 35 between the first implant region 32 and the second implant region 34. The second sub-implant region 38 having the lower implant concentration is distant from the junction 35 between the first implant region 32 and the second implant region 34.

In some embodiments, the substrate 12 may be an N-type substrate.

When the substrate 12 is an N-type substrate, the first well zone 14 is an N-type well zone, the second well zone 16 is a P-type well zone, the first implant region 32 is a P-type implant region, and the second implant region 34 is an N-type implant region.

In some embodiments, the first implant region 32 or the second implant region 34 not including the sub-implant regions has an implant concentration ranging from $1.0E15\ cm^{-3}$ to $1.0E16\ cm^{-3}$. In this embodiment, the first implant region 32 not including the first sub-implant region 36 and the second sub-implant region 38 has an implant concentration ranging from $1.0E15\ cm^{-3}$ to $1.0E16\ cm^{-3}$.

In some embodiments, the sub-implant region having the higher implant concentration has an implant concentration ranging from $2.0E16\ cm^{-3}$ to $6.0E16\ cm^{-3}$. In this embodiment, the first sub-implant region 36 having the higher implant concentration has an implant concentration ranging from $2.0E16\ cm^{-3}$ to $6.0E16\ cm^{-3}$.

In some embodiments, the sub-implant region having the lower implant concentration has an implant concentration ranging from $1.0E16\ cm^{-3}$ to $4.0E16\ cm^{-3}$. In this embodiment, the second sub-implant region 38 having the lower implant concentration has an implant concentration ranging from $1.0E16\ cm^{-3}$ to $4.0E16\ cm^{-3}$.

In some embodiments, the insulation region 26 may comprise a shallow trench isolation (STI), as shown in FIG. 7.

Figure 8:
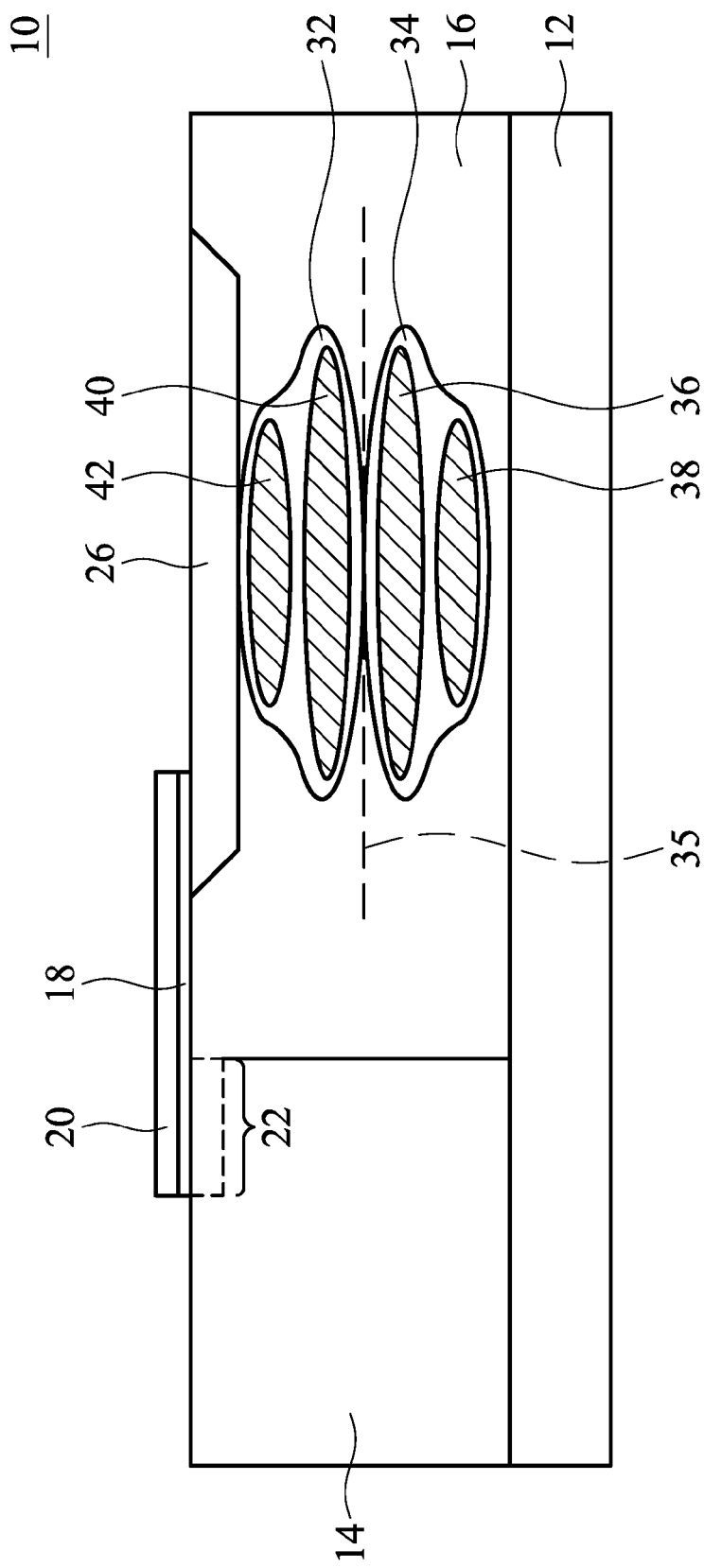
FIG. 8 is a cross-sectional view of an ultra-high voltage device in accordance with one embodiment of the invention.

Referring to FIG. 8, in accordance with one embodiment of the invention, an ultra-high voltage device 10 is provided. FIG. 8 is a cross-sectional view of the ultra-high voltage device 10.

As shown in FIG. 8, in this embodiment, the ultra-high voltage device 10 comprises a substrate 12, a first well zone 14, a second well zone 16, a gate oxide layer 18, a gate 20, a channel 22, an insulation region 26, a first implant region 32, and a second implant region 34.

The first well zone 14 is formed in the substrate 12. The second well zone 16 is formed in the substrate 12 adjacent to the first well zone 14. The gate oxide layer 18 is formed on the first well zone 14 and the second well zone 16 of the substrate 12. The gate 20 is formed on the gate oxide layer 18. The channel 22 is formed in the first well zone 14 below the gate oxide layer 18. The insulation region 26 is formed on the surface of the second well zone 16 of the substrate 12. The first implant region 32 is formed in the second well zone 16 underneath the insulation region 26. The second implant region 34 is formed below the first implant region 32. A junction 35 is formed between the first implant region 32 and the second implant region 34.

Specifically, at least one of the first implant region 32 and the second implant region 34 comprises at least two sub-implant regions. For example, the second implant region 34 comprises a first sub-implant region 36 and a second sub-implant region 38, and the first implant region 32 comprises a third sub-implant region 40 and a fourth sub-implant region 42, as shown in FIG. 8. The sub-implant regions (36/38 and 40/42) have different implant concentrations. The sub-implant region having the higher implant concentration is adjacent to the junction 35 between the first implant region 32 and the second implant region 34. The sub-implant region having the lower implant concentration is distant from the junction 35 between the first implant region 32 and the second implant region 34. For example, the first sub-implant region 36 having the higher implant concentration is adjacent to the junction 35 between the first implant region 32 and the second implant region 34. The second sub-implant region 38 having the lower implant concentration is distant from the junction 35 between the first implant region 32 and the second implant region 34. The third sub-implant region 40 having the higher implant concentration is adjacent to the junction 35 between the first implant region 32 and the second implant region 34. The fourth sub-implant region 42 having the lower implant concentration is distant from the junction 35 between the first implant region 32 and the second implant region 34.

In some embodiments, the substrate 12 may be an N-type substrate.

When the substrate 12 is an N-type substrate, the first well zone 14 is an N-type well zone, the second well zone 16 is a P-type well zone, the first implant region 32 is a P-type implant region, and the second implant region 34 is an N-type implant region.

In some embodiments, the sub-implant region having the higher implant concentration has an implant concentration ranging from 2.0E16 $cm^{-3}$ to 6.0E16 $cm^{-3}$. In this embodiment, the first sub-implant region 36 and the third sub-implant region 40 having the higher implant concentration have an implant concentration ranging from 2.0E16 $cm^{-3}$ to 6.0E16 $cm^{-3}$.

In some embodiments, the sub-implant region having the lower implant concentration has an implant concentration ranging from 1.0E16 $cm^{-3}$ to 4.0E16 $cm^{-3}$. In this embodiment, the second sub-implant region 38 and the fourth sub-implant region 42 having the lower implant concentration have an implant concentration ranging from 1.0E16 $cm^{-3}$ to 4.0E16 $cm^{-3}$.

In some embodiments, the insulation region 26 may comprise a shallow trench isolation (STI), as shown in FIG. 8.

Referring to FIG. 1, in accordance with one embodiment of the invention, a method for fabricating an ultra-high voltage device is provided. FIG. 1 is a cross-sectional view of the method for fabricating an ultra-high voltage device.

As shown in FIG. 1, in this embodiment, the method for fabricating an ultra-high voltage device comprises the following steps. A substrate 12 comprising a first well zone 14, a second well zone 16, a gate oxide layer 18, a gate 20, and an insulation region 26 is provided. In the structure of the substrate 12, the first well zone 14 is adjacent to the second well zone 16. The gate oxide layer 18 is formed on the first well zone 14 and the second well zone 16. The gate 20 is formed on the gate oxide layer 18. The insulation region 26 is formed on the surface of the second well zone 16.

Next, a first implant process (not shown) is performed to form a first implant region 32 in the second well zone 16 underneath the insulation region 26.

Next, a second implant process (not shown) is performed to form a second implant region 34 below the first implant region 32.

Specifically, a junction 35 is formed between the first implant region 32 and the second implant region 34. At least one of the first implant region 32 and the second implant region 34 comprises at least two sub-implant regions. For example, the second implant region 34 comprises two sub-implant regions (36 and 38). The sub-implant regions (36 and 38) have different implant concentrations. For example, the sub-implant region 36 having the higher implant concentration is adjacent to the junction 35. The sub-implant region 38 having the lower implant concentration is distant from the junction 35.

In this embodiment, the first implant process (not shown) provides a single implant concentration to form the first implant region 32 which possesses the single implant concentration.

In this embodiment, the second implant process (not shown) provides a higher implant concentration and a lower implant concentration to form the second implant region 34 comprising the sub-implant regions (36 and 38) which possess different implant concentrations.

In some embodiments, the first implant region 32 or the second implant region 34 not including the sub-implant regions has an implant concentration ranging from 1.0E15 $cm^{-3}$ to 1.0E16 $cm^{-3}$. In this embodiment, the first implant region 32 not including the first sub-implant region 36 and the second sub-implant region 38 has an implant concentration ranging from 1.0E15 $cm^{-3}$ to 1.0E16 $cm^{-3}$.

In some embodiments, the sub-implant region having the higher implant concentration has an implant concentration ranging from 2.0E16 $cm^{-3}$ to 6.0E16 $cm^{-3}$. In this embodiment, the first sub-implant region 36 having the higher implant concentration has an implant concentration ranging from 2.0E16 $cm^{-3}$ to 6.0E16 $cm^{-3}$.

In some embodiments, the sub-implant region having the lower implant concentration has an implant concentration ranging from 1.0E16 $cm^{-3}$ to 4.0E16 $cm^{-3}$. In this embodiment, the second sub-implant region 38 having the lower implant concentration has an implant concentration ranging from 1.0E16 $cm^{-3}$ to 4.0E16 $cm^{-3}$.

EXAMPLES

Example 1

Figure 9:
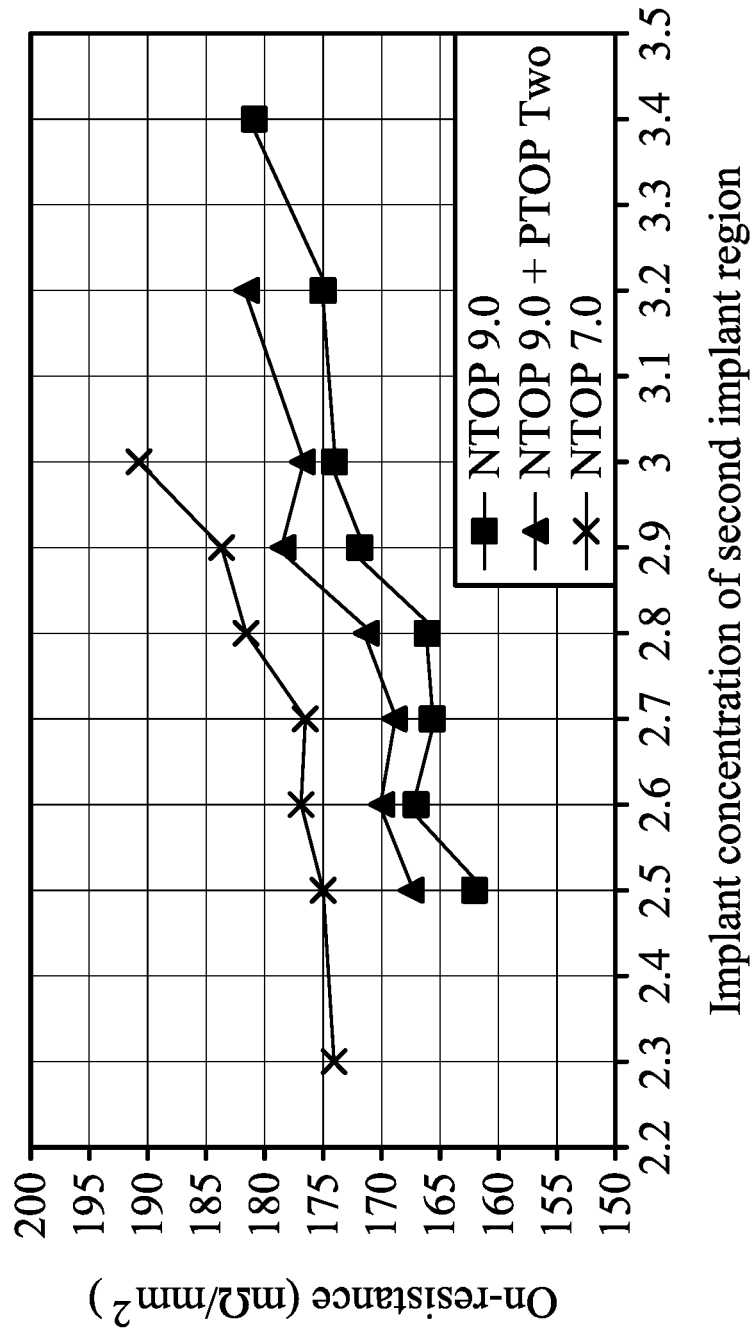
FIG. 9 shows the effects of the arrangement of various implant concentrations and implant profiles on the on-state resistance (Rds-on) in accordance with one embodiment of the invention.
Figure 10:
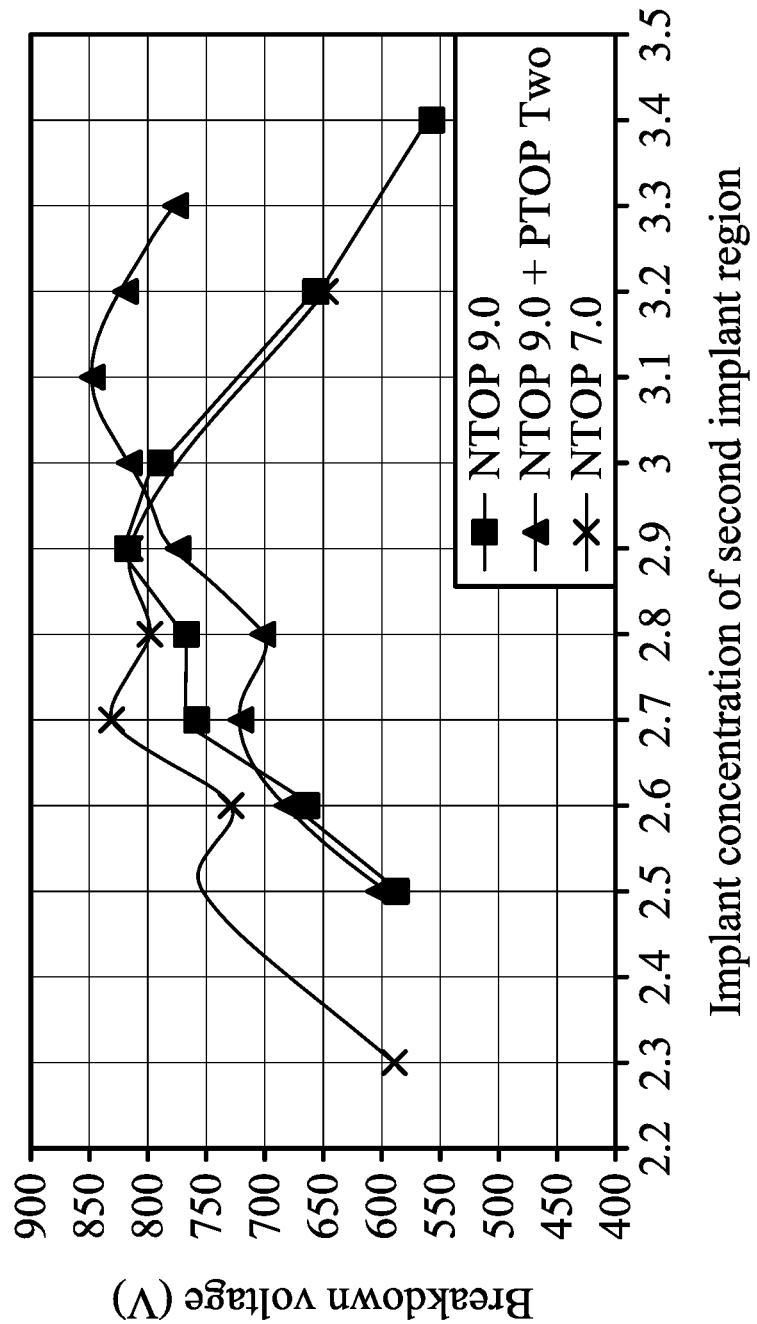
FIG. 10 shows the effects of the arrangement of various implant concentrations and implant profiles on the breakdown voltage (BV) in accordance with one embodiment of the invention.

Referring to FIGS. 9 and 10, in this example, the effect of performing various implant concentrations and implant profiles on the implant regions below the insulation region in the ultra-high voltage device on the on-state resistance (Rds-on) and breakdown voltage (BV) is described through FIGS. 9 and 10. FIG. 9 shows the effect of performing various implant concentrations and implant profiles on the implant regions below the insulation region in the device on the on-state resistance (Rds-on) in accordance with one embodiment of the invention. FIG. 10 shows the effect of performing various implant concentrations and implant profiles on the implant regions below the insulation region in the device on the breakdown voltage (BV) in accordance with one embodiment of the invention.

In FIG. 9, the ultra-high voltage device 10 disclosed by FIG. 1 was adopted and tested. The effect of performing the implant profiles of the first implant region with the implant concentration of 9.0 (NTOP 9.0), the first implant region with the implant concentration of 9.0 combined with the second implant region including the two sub-implant regions (NTOP 9.0+PTOP Two), and the first implant region with the implant concentration of 7.0 (NTOP 7.0) below the insulation region in the device on the on-state resistance (Rds-on) was estimated. The results shown in FIG. 9 indicate that the on-state resistance (Rds-on) acquired by performing the implant profile of the first implant region with the implant concentration of 9.0 combined with the second implant region including the two sub-implant regions (NTOP 9.0+PTOP Two) below the insulation region in the device is close to the on-state resistance (Rds-on) acquired by performing the implant profile of the first implant region with the implant concentration of 9.0 (NTOP 9.0) below the insulation region in the device. It is shown that the implant profiles disclosed by the present invention allow the device to maintain a low on-state resistance (Rds-on).

In FIG. 10, the ultra-high voltage device 10 disclosed by FIG. 1 was adopted and tested. The effect of performing the implant profiles of the first implant region with the implant concentration of 9.0 (NTOP 9.0), the first implant region with the implant concentration of 7.0 (NTOP 7.0), and the first implant region with the implant concentration of 9.0 combined with the second implant region including the two sub-implant regions (NTOP 9.0+PTOP Two) below the insulation region in the device on the breakdown voltage (BV) was estimated. The results shown in FIG. 10 indicate that a relatively high breakdown voltage (BV) is acquired by performing the implant profile of the first implant region with the implant concentration of 9.0 combined with the second implant region including the two sub-implant regions (NTOP 9.0+PTOP Two) below the insulation region in the device.

In the present invention, the implant profile of the second implant region is altered in cases where the first implant region in the second well zone (the draft zone) maintains a high implant concentration. That is, in the second implant region, at least two sub-implant regions are formed which have different implant concentrations, specifically, the sub-implant region having the higher implant concentration is adjacent to the junction between the first implant region and the second implant region, and the sub-implant region having the lower implant concentration is distant from the junction between the first implant region and the second implant region. A non-gradient implant profile is thus formed in the second implant region due to the sub-implant regions having different implant concentrations. Therefore, besides maintaining a low on-resistance (Rds-on) in the device through the formation of the first implant region with a high implant concentration, the breakdown voltage (BV) of the device is also effectively improved by the arrangement of the specific implant profile of the second implant region which is capable of providing a larger depletion space below the insulation region.

In addition, the disclosed implant technique capable of forming non-gradient profiles has been widely applied in various semiconductor structures having a field oxide layer or shallow trench isolation (STI).

While the invention has been described by way of example and in terms of preferred embodiment, it should be understood that the invention is not limited thereto. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An ultra-high voltage device, comprising:
a substrate;
a first well zone formed in the substrate;
a second well zone formed in the substrate adjacent to the first well zone;
a gate oxide layer formed on the first well zone and the second well zone of the substrate;
a gate formed on the gate oxide layer;
an insulation region formed on the surface of the second well zone of the substrate;
a first implant region formed in the second well zone underneath the insulation region;
a second implant region formed below the first implant region; and
a junction formed between the first implant region and the second implant region, wherein at least one of the first implant region and the second implant region comprises at least two sub-implant regions having different implant concentrations, wherein the sub-implant region having a higher implant concentration is adjacent to the junction, and the sub-implant region having a lower implant concentration is distant from the junction.

2. The ultra-high voltage device as claimed in claim 1, wherein the substrate is a P-type substrate.

3. The ultra-high voltage device as claimed in claim 2, wherein the first well zone is a P-type well zone.

4. The ultra-high voltage device as claimed in claim 3, wherein the second well zone is an N-type well zone.

5. The ultra-high voltage device as claimed in claim 4, wherein the first implant region is an N-type implant region.

6. The ultra-high voltage device as claimed in claim 5, wherein the second implant region is a P-type implant region.

7. The ultra-high voltage device as claimed in claim 1, wherein the first implant region or the second implant region not including the sub-implant regions has an implant concentration ranging from $1.0E15$ $cm^{-3}$ to $1.0E16$ $cm^{-3}$.

8. The ultra-high voltage device as claimed in claim 1, wherein the sub-implant region having the higher implant concentration has an implant concentration ranging from $2.0E16$ $cm^{-3}$ to $6.0E16$ $cm^{-3}$.

9. The ultra-high voltage device as claimed in claim 1, wherein the sub-implant region having the lower implant concentration has an implant concentration ranging from $1.0E16$ $cm^{-3}$ to $4.0E16$ $cm^{-3}$.

10. The ultra-high voltage device as claimed in claim 1, wherein the insulation region comprises a field oxide layer or a shallow trench isolation (STI).

11. A method for fabricating an ultra-high voltage device, comprising:
  providing a substrate comprising a first well zone, a second well zone, a gate oxide layer, a gate, and an insulation region, wherein the first well zone is adjacent to the second well zone, the gate oxide layer is formed on the first well zone and the second well zone, a gate is formed on the gate oxide layer, and an insulation region is formed on the surface of the second well zone;
  performing a first implant process to form a first implant region in the second well zone underneath the insulation region; and
  performing a second implant process to form a second implant region below the first implant region, wherein a junction is formed between the first implant region and the second implant region, and at least one of the first implant region and the second implant region comprises at least two sub-implant regions having different implant concentrations, wherein the sub-implant region having the higher implant concentration is adjacent to the junction, and the sub-implant region having the lower implant concentration is distant from the junction.

12. The method for fabricating an ultra-high voltage device as claimed in claim 11, wherein the first implant process provides a single implant concentration to form the first implant region having the single implant concentration.

13. The method for fabricating an ultra-high voltage device as claimed in claim 11, wherein the first implant process provides a higher implant concentration and a lower implant concentration to form the first implant region comprising the sub-implant regions having different implant concentrations.

14. The method for fabricating an ultra-high voltage device as claimed in claim 11, wherein the second implant process provides a single implant concentration to form the second implant region having the single implant concentration.

15. The method for fabricating an ultra-high voltage device as claimed in claim 11, wherein the second implant process provides a higher implant concentration and a lower implant concentration to form the second implant region comprising the sub-implant regions having different implant concentrations.

16. The method for fabricating an ultra-high voltage device as claimed in claim 11, wherein the first implant region or the second implant region not including the sub-implant regions has an implant concentration ranging from $1.0E15$ $cm^{-3}$ to $1.0E16$ $cm^{-3}$.

17. The method for fabricating an ultra-high voltage device as claimed in claim 11, wherein the sub-implant region having the higher implant concentration has an implant concentration ranging from $2.0E16$ $cm^{-3}$ to $6.0E16$ $cm^{-3}$.

18. The method for fabricating an ultra-high voltage device as claimed in claim 11, wherein the sub-implant region having the lower implant concentration has an implant concentration ranging from $1.0E16$ $cm^{-3}$ to $4.0E16$ $cm^{-3}$.

* * * * *